United States Patent
Kiel

(10) Patent No.: US 11,081,970 B2
(45) Date of Patent: Aug. 3, 2021

(54) ASSEMBLY OF BUS BARS FORMING A CASING AND HEAT DISSIPATOR FOR AN ELECTRONIC POWER DEVICE

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 16/975,079

(22) PCT Filed: Feb. 22, 2019

(86) PCT No.: PCT/FR2019/050412
§ 371 (c)(1),
(2) Date: Aug. 21, 2020

(87) PCT Pub. No.: WO2019/166721
PCT Pub. Date: Sep. 6, 2019

(65) Prior Publication Data
US 2020/0403523 A1 Dec. 24, 2020

(30) Foreign Application Priority Data
Feb. 27, 2018 (FR) ...................................... 1851689

(51) Int. Cl.
*H05K 7/14* (2006.01)
*H05K 7/20* (2006.01)
(Continued)

(52) U.S. Cl.
CPC .............. *H02M 7/003* (2013.01); *H02G 5/10* (2013.01); *H05K 7/14* (2013.01); *H05K 7/2039* (2013.01); *H05K 7/2089* (2013.01); *H01L 23/473* (2013.01)

(58) Field of Classification Search
CPC ... H01L 23/473; H01L 23/051; H01L 25/165; H05K 7/1432; H05K 7/2039;
(Continued)

(56) References Cited

U.S. PATENT DOCUMENTS 3,555,293 A * 1/1971 Shannon ................ H02G 5/007
307/147
3,584,138 A * 6/1971 Pritzen, Jr. ............... H02G 5/06
174/68.3
(Continued)

OTHER PUBLICATIONS

International Search Report for PCT/FR2019/050412 dated Jun. 25, 2019.
Written Opinion for PCT/FR2019/050412 dated Jun. 25, 2019.

*Primary Examiner* — Adam B Dravininkas
(74) *Attorney, Agent, or Firm* — Sandberg Phoenix & von Gontard, P.C.

(57) ABSTRACT

The assembly of bus bars according to the invention comprises a plurality of sectors of bus bars (S1 to S6) which are arranged, in a connected manner and with electrical contact, around a central axis (C) and upper and lower closing plates (BPD) which are perpendicular to the central axis, the sectors of bus bars each comprising an external portion of bus bar (B11 to B16) and at least one internal portion of bus bar (B21 to B26, B31 to B36) which delimit a plurality of internal volumes, the upper and lower closing plates being in contact against upper and lower faces of the portions of bus bar, respectively, and the portions of bus bar comprising a plurality of electrical contact faces of the type referred to as "press pack".

11 Claims, 2 Drawing Sheets

(51) Int. Cl.
*H01L 23/473* (2006.01)
*H02M 7/00* (2006.01)
*H02G 5/10* (2006.01)

(58) Field of Classification Search
CPC ........ H05K 7/209; H05K 7/2089; H05K 7/14; H02M 7/003; H02G 5/10
See application file for complete search history.

(56) References Cited

U.S. PATENT DOCUMENTS

| | | | | |
|---|---|---|---|---|
| 4,945,188 | A * | 7/1990 | Jackson | H02G 5/002 |
| | | | | 174/16.2 |
| 5,442,135 | A * | 8/1995 | Faulkner | H02G 5/007 |
| | | | | 174/68.2 |
| 5,619,014 | A * | 4/1997 | Faulkner | H02G 5/007 |
| | | | | 174/129 B |
| 6,265,666 | B1 * | 7/2001 | Faulkner | H02G 5/06 |
| | | | | 174/70 B |
| 6,501,653 | B1 * | 12/2002 | Landsgestell | H02M 7/003 |
| | | | | 165/185 |
| 6,778,389 | B1 * | 8/2004 | Glovatsky | H01L 25/065 |
| | | | | 165/80.1 |
| 9,681,568 | B1 | 6/2017 | Wagoner et al. | |
| 2005/0269895 | A1 * | 12/2005 | Innami | B62D 5/0403 |
| | | | | 310/429 |
| 2009/0080158 | A1 * | 3/2009 | Conn | H05K 7/20927 |
| | | | | 361/699 |
| 2010/0059878 | A1 * | 3/2010 | Crane | H01L 23/473 |
| | | | | 257/707 |
| 2016/0013706 | A1 * | 1/2016 | Mukunoki | H02K 11/33 |
| | | | | 310/68 D |
| 2020/0014178 | A1 * | 1/2020 | Takahashi | H02B 1/20 |

* cited by examiner

ASSEMBLY OF BUS BARS FORMING A CASING AND HEAT DISSIPATOR FOR AN ELECTRONIC POWER DEVICE

CROSS-REFERENCE TO RELATED APPLICATIONS

This application is the US National Stage under 35 USC § 371 of International Application No. PCT/FR2019/050412, filed 22 Feb. 2019 which claims the priority of French App. No. 1851689 filed Feb. 27, 2018, the contents (text, drawings, and claims) of both being incorporated herein by reference.

BACKGROUND

The invention relates in general to the field of power electronics. More specifically, the invention relates to an assembly of bus bars forming a casing and heat dissipator for electronic power devices such as current inverters and power converters, but not exclusively. The invention also relates to electronic power devices incorporating the above-mentioned assembly of bus bars.

Electronic power devices, such as current inverters and power converters, are commonly used in numerous fields, such as transport, industry, lighting, heating, etc. With the desired energy transition toward renewable energy sources which produce fewer $CO_2$ emissions, power electronics is set to become even more widespread and will have to respond to increasing economic and technological constraints.

Current research and development in the field of electronic power devices focus in particular on reducing costs, improving the power density for higher compactness, improving reliability, reducing parasitic elements and electromagnetic radiation, and thermally transferring dissipated energy.

The availability of new power semiconductors, such as silicon carbide (SiC) and gallium nitride (GaN) today and, shortly, diamond, allows the design of electronic power devices having higher current densities, increased commutation frequency and higher voltages. In addition, the effective use of these new semiconductors in electronic power devices results in improving compactness.

The compactness of electronic power devices is constrained in particular by the need to remove the heat released and ensure voltage resistance. Increased voltages counter the compactness of the converters since the greater risks of discharge often impose an increase in the distances between the components having different electrical potentials. The maximum power density which is allowable by the components limits the amplitude of the currents switched in order to maintain the junction temperatures below critical values. Effective cooling devices are indispensable for maintaining the thermal balance of the devices.

It is essential to reduce resistive, inductive, and capacitive parasitic elements in order to achieve the best possible compromise between the search for compactness and satisfying different design constraints. Parasitic inductances in the power bus bars hinder increased switching frequencies. Increased switching frequencies are favorable for compactness but increase switching losses and the power dissipated by the components. It is necessary to reduce parasitic inductances in order to protect the circuits against potentially destructive excess voltage, to improve control of the electromagnetic radiation, to reduce the heat generated, and to increase the switching speed.

The search for an increased compactness of the electronic power devices requires the active and passive components to be able to maintain temperatures below critical values, in order to achieve a thermal balance and ensure reliability. It is desirable to extract the dissipated energy as close to the components as possible. The thermal path between the heat sources composed of components and the heat sinks composed of thermal dissipation means must be optimized.

The different constraints which apply to the electronic power devices have led to a modular design of switching bridges, having basic power switching modules, referred to as "power modules," which each correspond to a switching path of the bridge.

3D designs are proposed for the power modules, having double-sided cooling of the power chips, and having a certain interest for increasing the compactness of electronic power devices.

In order to improve reliability, in particular in applications where thermal cycles are harsh, the so-called "press pack" technology is used in order to eliminate welding which deteriorates with the mechanical constraints due to the thermal cycling. In "press pack" technology, electrical contacts are provided using mechanical pressing or clamping means which maintains the components in place and in contact. "Press pack" technology also has advantage of facilitating the disassembly of the devices and therefore their repair.

BRIEF SUMMARY

Presently, it appears to be favorable to propose a novel modular design of bus bars in order to produce more compact and optimized electronic power devices which allow a better compromise in satisfying the above-mentioned design constraints and which are intended to be adapted to the novel power semiconductors SiC and GaN, as well as 3D technology and "press pack" technology.

According to a first aspect, an assembly of bus bars forming a casing and a heat dissipator for an electronic power device comprises a plurality of bus bar sectors arranged, in a connected manner and with electrical contact, around a central axis and upper and lower closing plates which are perpendicular to the central axis, the bus bar sectors each comprising an external bus bar portion and at least one internal bus bar portion which delimit a plurality of internal volumes, the upper and lower closing plates being in contact against upper and lower faces of the bus bar portions, respectively, and the bus bar portions comprising a plurality of electrical contact faces of the so-called "press pack" type.

According to a particular characteristic, the external bus bar portions of the plurality of bus bar sectors comprise cooling fins on an external face.

According to another particular characteristic, the bus bar portions of the plurality of bus bar sectors are made of copper and/or aluminum and are produced by molding and/or machining and/or cutting a profiled bar.

According to another particular characteristic, the assembly of bus bars comprises seals located in the connection faces between adjacent external bus bar portions and between the upper and lower closing plates and the external bus bar portions.

According to another particular characteristic, the upper and lower closing plates are laminated and each comprise a central dielectric layer and two electrically conductive plates on both sides of the central dielectric layer, the electrically conductive plates being in electrical contact with the bus bar portions.

According to another particular characteristic, the dielectric layer comprises at least one embedded electronic circuit and/or an active or passive embedded electronic component.

According to another particular characteristic, the at least one of said upper and lower closing plates is of the so-called "IMS" type.

According to another particular characteristic, the electrically conductive plates are made of copper and/or aluminum.

According to another particular characteristic, in each of said bus bar sectors, the plurality of internal volumes comprise a first internal volume delimited between an electrical contact face of the external bus bar portion and an electrical contact face of a first internal bus bar portion, the first internal volume being intended for installation of the "press pack" type of an electronic power circuit.

According to another particular characteristic, in each of the bus bar sectors, the plurality of internal volumes comprise at least one other internal volume accommodated between the first internal bus bar portion and the central axis.

According to another particular characteristic, in each of the bus bar sectors, the plurality of internal volumes comprise a second internal volume accommodated between the first internal bus bar portion and a second internal bus bar portion and a third internal volume accommodated between the second internal bus bar portion and the central axis.

DESCRIPTION OF THE FIGURES

Other advantages and characteristics will become clearer upon reading the detailed description below of a particular embodiment of the invention, with reference to the annexed drawings, in which.

DETAILED DESCRIPTION

Figure 1:
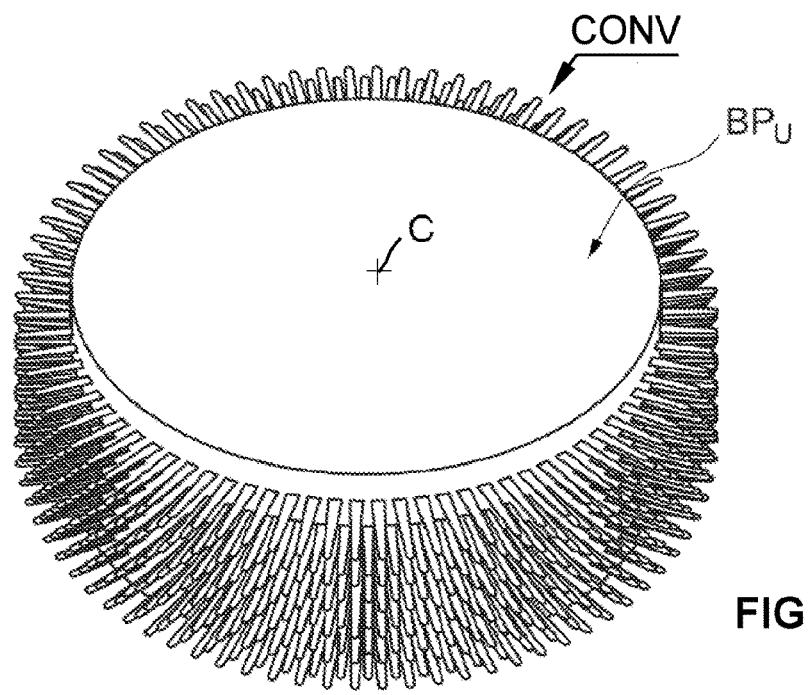
FIGS. 1 and 2 are perspective views showing a particular embodiment of an assembly of bus bars.
Figure 2:
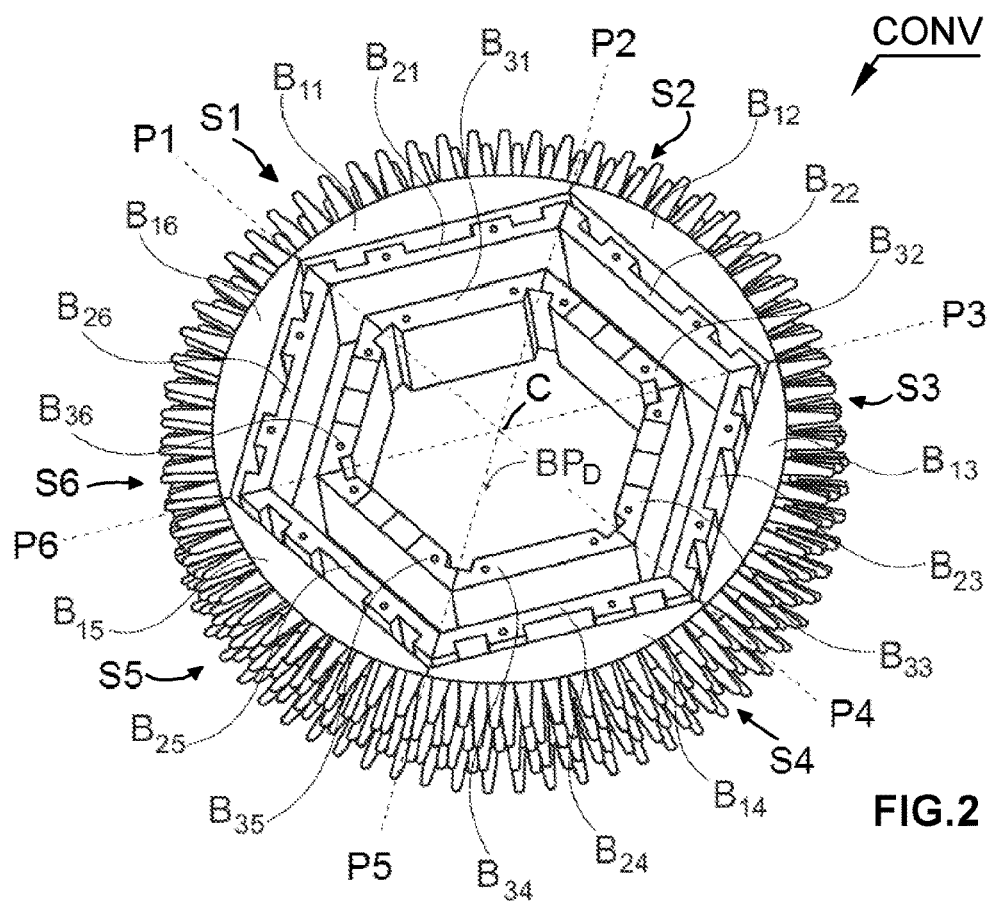

A particular embodiment CONV of an assembly of bus bars is shown in FIGS. 1 and 2. This assembly of bus bars has the external appearance of a puck or cylindrical disc.

The assembly CONV of bus bars essentially comprises a plurality of sections S1 to S6 of bus bars and upper and lower closing plates $BP_U$ and $BP_D$. There are six sections S1 to S6 of bus bars in this embodiment. Of course, in the present invention, the number of sections of bus bars is not limited to six. This number will depend on the application in which the invention is implemented.

The sections S1 to S6 of bus bars have a similar design and are arranged in a connected manner in a circle around a central axis C. In this case, each section S1 to S6 of bus bar occupies an angular sector of 60°.

In this particular embodiment, the sections S1 to S6 of bus bars are each formed from an external bus bar portion and from first and second internal bus bar portions. The bus bar portions are formed from conductive metals such as aluminum or copper. It will be possible for the bus bar portions to be produced by molding and/or machining and/or cutting a profiled bar.

Taking into consideration any section Sn of bus bar, the external bus bar portion is designated $B_{1n}$ and the first and second internal bus bar portions are designated $B_{2n}$ and $B_{3n}$, respectively.

As shown in FIG. 2, the external bus bar portions $B_{11}$ to $B_{16}$ are arranged so as to form a wall, around the central axis C, which the external lateral wall of the circular casing in the shape of a disc. The internal bus bar portions $B_{21}$ to $B_{26}$ are arranged so as to form a first internal lateral wall, around the central axis C, locating within the volume delimited by the external lateral wall formed by the external bus bar portions $B_{11}$ to $B_{16}$. The internal bus bar portions $B_{31}$ to $B_{36}$ are arranged so as to form a second internal lateral wall, around the central axis C, located within the volume delimited by the first internal lateral wall formed by the internal bus bar portions $B_{21}$ to $B_{26}$.

The bus bar portions $B_{1n}$, $B_{2n}$ and $B_{3n}$ forming the external lateral wall and the first and second internal lateral walls, respectively, are connected in pairs by the longitudinally opposite ends which are located in connection planes P1 to P6 comprising the central axis C and are perpendicular to the upper and lower closing plates $BP_U$ and $BP_D$. The bus bar portions of a same lateral wall are in electrical continuity. Therefore, the external lateral wall and the first and second internal lateral walls each form an electrical bus bar.

As can be seen in FIGS. 1 and 2, the bus bar portions $B_{11}$ to $B_{16}$ comprise a plurality of cooling fins which are formed on an external lateral face in a semi-circle thereof. Therefore, the external lateral wall forms a thermal dissipator.

The bus bar section Sn comprising the bus bar portions $B_{1n}$, $B_{2n}$ and $B_{3n}$ and internal volumes E1, E2 and E3 provided between these portions are now described in detail with reference to FIG. 3.

Figure 3:
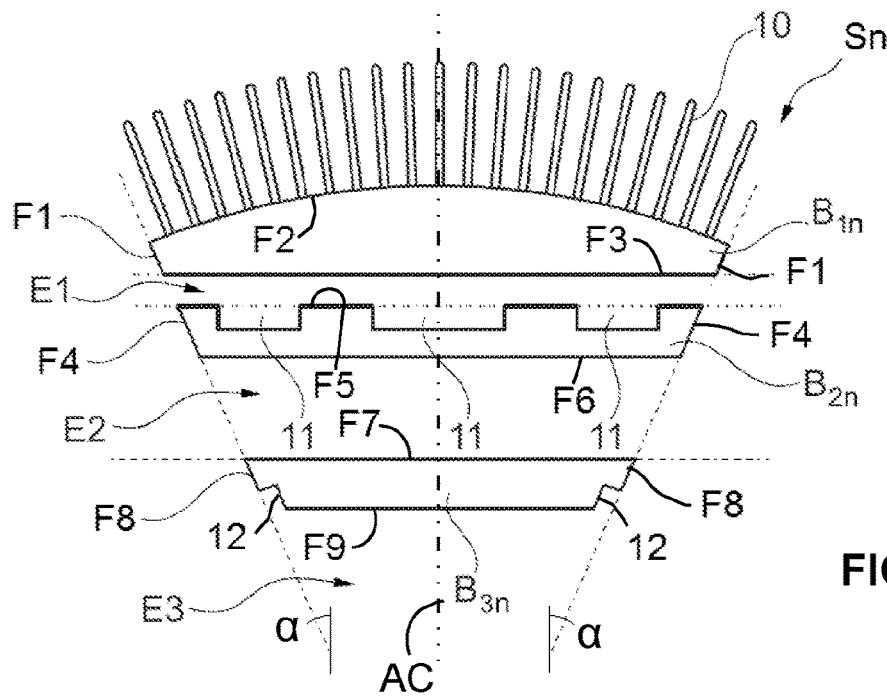
FIG. 3 is a simplified design view showing a bus bar sector included in the assembly of bus bars of FIGS. 1 and 2.

In addition to the semi-circular external lateral face, designated F2 in FIG. 3, the bus bar portion $B_{1n}$ comprises in particular two inclined connection faces F1, which are substantially planar, and a substantially planar internal face F3.

The cooling fins, designated 10 in FIG. 3, extend radially outward from the semi-circular external lateral face F2. The two connection faces F1 form longitudinally opposite ends of the portion and are inclined at an angle α in relation to a central axis of symmetry AC.

With the bus bar section Sn occupying an angular sector of 60° in this embodiment, the angle α in this case is 30°. In the assembly CONV of bus bars, the substantially planar connection faces F1 of the bus bar sections Sn are therefore in contact, at corresponding connection planes (cf. P1 to P6 in FIG. 2), with corresponding connection faces F1 of the adjacent bus bar sections S(n+1) and S(n−1). It should be noted here that the term "planar" used here to describe the connection faces F1 should not be interpreted in a strict manner. Indeed, as will be described in more detail in the following, these connection faces F1 will typically comprise arrangements such as grooves for accommodating seals. Detachable mechanical attaching means can also be arranged on these connection faces F1.

The substantially planar internal face F3 is a clamping contact face having an electronic power circuit (not shown). As indicated for the connection face F1, the term "planar" used here to describe the internal face F3 should not be interpreted in a strict manner, given that different arrangements can be provided depending on the applications.

The bus bar portion $B_{2n}$ comprises in particular two connection faces F4 forming longitudinally opposite ends of the portion and the first and second faces F5 and F6.

Similarly to the faces F1 of the bus bar portion $B_{1n}$, the two connection faces F4 are inclined at the angle $\alpha$ in relation to the central axis of symmetry AC. The connection faces F4 correspond to the connection planes (cf. P1 to P6 in FIG. 2) with the adjacent sections of bus bars.

The first face F5 is a clamping contact face having the above-mentioned electronic power circuit. As shown in FIG. 3, channels 11 are arranged in this first face F5 and are typically intended to circulate, or replace, a liquid having a heat transfer function and/or a fireproofing function and/or an electrical insulation function. Of course, in other embodiments, liquid channels could also, or exclusively, be formed in the internal face F3 of the bus bar portion $B_{1n}$. It should be noted here that the fireproofing and electrical insulation functions make it possible to avoid electrical discharges and fires being started, and therefore a consecutive possible degradation of the casing.

The faces F3 and F5 are suitable for a "press pack" type assembly of the above-mentioned electronic power circuit between the bus bar portions $B_{1n}$ and $B_{2n}$. An internal volume E1 is arranged between the face F3 and F5 and is intended to receive the electronic power circuit.

Typically, the bus bar portions $B_{1n}$ and $B_{2n}$ are intended to be brought to negative (−) and positive (+) polarities of a continuous voltage between the bus bars, the negative polarity (−) corresponding to the ground polarity. In an electronic power device using a switching bridge, the electronic power circuit will typically be a power module corresponding to a path of the switching bridge. The embodiment described here of the assembly of bus bars, having six sections of bus bars, will be suitable for a switching bridge having six paths, for example, to supply power to a hexaphase electric motor.

The second face F6 of the bus bar portion $B_{2n}$ is a substantially planar face oriented facing a substantially planar first face F7 of the bus bar portion $B_{3n}$. In this case, the second face F6 and the first face F7 are substantially parallel and define a second internal volume E2.

In addition to the first face F7, the bus bar portion $B_{3n}$ comprises in particular two connection faces F8, which form the longitudinally opposite ends of the portion, and a second face F9.

Similarly to the faces F1 of the bus bar portion Bin, the two connection faces F8 are inclined at the angle $\alpha$ in relation to the central axis of symmetry AC. The connection faces F8 correspond to connection planes (cf. P1 to P6 in FIG. 2) with the adjacent sections of bus bars. Here, grooves 12 are provided in the connection faces F8 for accommodating the indexing and/or clamping means (not shown).

The second face F9 is substantially planar and parallel to the first face F7 and delimits a central internal volume E3 in the assembly CONV of bus bars.

According to the electronic power devices provided by means of the assembly CONV of bus bars, the internal volumes E2 and E3 of the bus bars sections S1 to S6 could perform different functions, for example, accommodating the energy storage means and/or circulating, or replacing, a liquid having a heat transfer function and/or a fireproofing function and/or an electrical insulation function. It should be noted here that the fireproofing and electrical insulation functions make it possible to avoid electrical discharges and fires being started, and therefore a consecutive possible degradation of the casing.

Therefore, for example, in an electronic power device using a switching bridge, the volumes E2 could be dedicated to accommodating capacitive filtration means, and the volumes E3 could be dedicated to circulating, or replacing, the heat transferring and/or fireproofing and/or electrically insulating liquid. In this case, the capacitive filtration means could be connected between the bus bars formed by the plurality of portions $B_{2n}$ and the plurality of portions $B_{3n}$. The bus bar formed by the plurality of portions $B_{3n}$ could, in an example such as this, be electrically coupled to the plurality of portions $B_{1n}$ for a "press pack" electrical connection of the capacitive filtration means between the faces F6 and F7. The capacitive filtration means could, for example, be formed by a plurality of multilayered ceramic capacitors distributed in the plurality of volumes E2. In other applications, the volumes E2 could, for example, be dedicated to circulating, or replacing, the heat transferring and/or fireproofing and/or electrically insulating liquid, and the volumes E3 could be dedicated to electrical energy storage means, for example in the form of a capacitor, a supercapacitor, lithium-ion batteries or the like.

The "press pack" assembly of the electronic components between the bus bar portions will use known assembly techniques such as resilient fasteners ensuring the required clamping or screws mounted through insulated screw passages to avoid short circuits.

It should be noted here that the circular disc shape of the assembly CONV of bus bars means that said assembly is perfectly suitable for integration into an electrical rotating machine, for example a traction motor or a reversible machine associated with a regenerative braking system.

The upper and lower closing plates $BP_U$ and $BP_D$ and their arrangement with the bus bar portions will now be described below with reference to FIGS. 4 and 5A, 5B and 5C.

As is clear from FIGS. 1 and 2, the upper and lower closing plates $BP_U$ and $BP_D$ have a first function which is to close the assembly CONV of bus bars in the upper part and the lower part in order to form the casing. The upper and lower closing plates $BP_U$ and $BP_D$ are in contact against the upper and lower faces of the bus bar portions, respectively.

Figure 4:
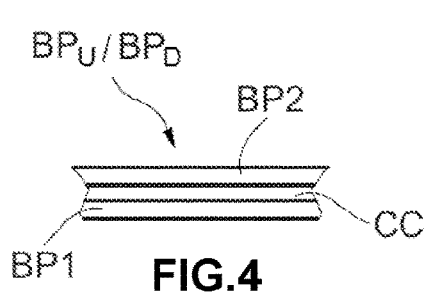
FIG. 4 is a simplified, partial, sectional view of a closing plate included in the assembly of bus bars from FIGS. 1 and 2.

As shown in FIG. 4, the upper and lower closing plates $BP_U$ and $BP_D$ are laminated plates which each comprise a central dielectric layer CC and two electrically conductive plates BP1 and BP2. The central dielectric layer CC is sandwiched between the two electrically conductive plates BP1 and BP2. Typically, IMS (insulated metal substrate) technology can be used to produce the plates $BP_U$ and $BP_D$.

The electrically conductive plates BP1 and BP2 are typically made of aluminum or copper. The thickness of the plates BP1, BP2 is selected depending on the current density which is intended to be carried. The conductive plates BP1 and BP2 form the first and second continuous current bus intended to be brought to negative (−) and positive (+) polarities. In the following paragraphs, it should be taken into consideration that the conductive plate BP1 is the plate which is located outside of the formed casing and that the conductive plate BP2 is the plate which is located within the formed casing.

A Faraday cage is produced by bringing the external bus bar portions $B_{1n}$ and the conductive plate BP1 to a same electrical potential, typically the ground potential of negative polarity (−). The casing formed with the assembly of bus bars according to the invention thus makes it possible to produce electromagnetic shielding which is favorable to the electromagnetic compatibility (EMC).

The central dielectric layer CC is typically formed from an epoxy resin which is reinforced with glass fibers, such as FR-4. A resin which is reinforced by organic fibers could also be used, as well as a non-reinforced polyimide. In certain applications, circuits or active or passive electronic components, for example, control circuits, could be embedded in the central dielectric layer CC using known techniques.

It should be noted here that the invention is perfectly suitable for SiP (system-in-package) applications.

Figure 5A:
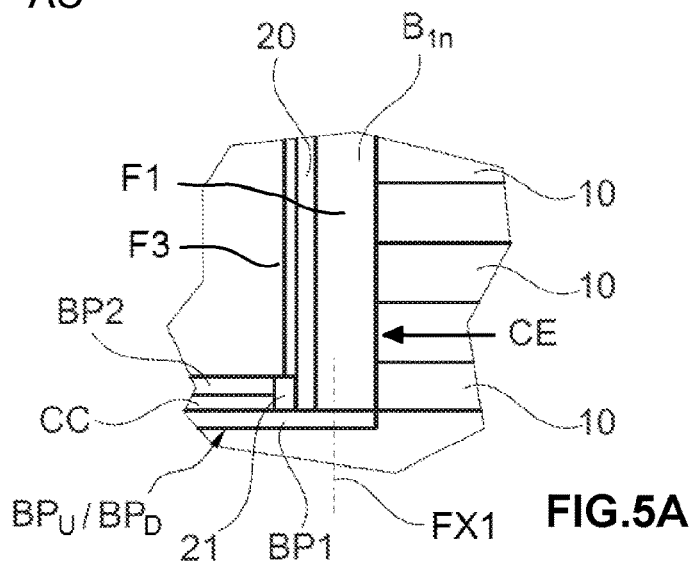
FIGS. 5A, 5B and 5C are simplified partial sectional views showing different assemblies of a closing plate and of bus bar portions included in the assembly of bus bars of FIGS. 1 and 2.

An example of a sealed assembly between the external bus bar portions Bin and the upper closing plate $BP_U$, or lower closing plate $BP_D$, is shown in FIG. 5A. FIG. 5A shows this assembly on a connection face F1 of the external bus bar portions $B_{1n}$.

In this assembly, the conductive plate BP1 of the closing plate $BP_U$, $BP_D$ is in electrical communication with the external bus bar portion $B_{1n}$. The mechanical attachment between the external bus bar portion $B_{1n}$ and the conductive plate BP1 is ensured, for example, by means of a screw (not shown) in the axis FX1.

As shown in FIG. 5A, seals 20 and 21, for example Viton® seals, are provided to ensure the seal between two adjacent external bus bar portions $B_{1n}$, at the connection faces F1 thereof, and between the external bus bar portions $B_{1n}$ and the closing plate $BP_U$, $BP_D$. The seal 20 is housed in a groove which extends along the entire height of the connection face F1 and ensures the seal at said face. The seal 21 is arranged in a shoulder accommodated in the closing plate $BP_U$, $BP_D$, more precisely between this shoulder and a groove accommodated in the face F3 of the external bus bar portion $B_{1n}$. In this case, the seal 21 also ensures a gap between the conductive plate BP1 and the external bus bar portion $B_{1n}$ for electrical insulation therebetween.

It should be noted that the detachable strapping means (cf. arrow CE in FIG. 5A), positioned between the fins 10, can be used to mechanically assemble the assembly CONV of bus bars.

Figure 5B:
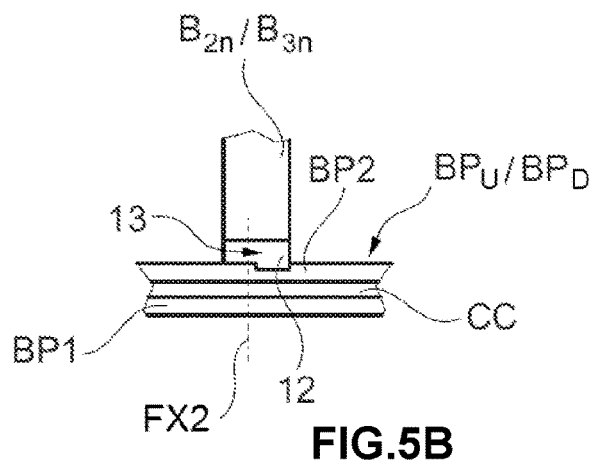

A first example of assembly between an internal bus bar portion $B_{2n}$, or $B_{3n}$, and the closing plate $BP_U$, or $BP_D$, is shown in FIG. 5B. The assembly example of FIG. 5B corresponds to the event where the conductive plate BP2 and the internal bus bar portion $B_{2n}$, $B_{3n}$, are intended to be set at the same electrical potential. As shown in FIG. 5B, the end of the internal bus bar portion $B_{2n}$, $B_{3n}$, comprises in this case an indexing tab 12 which is housed in an anchoring groove accommodated in the conductive plate BP2. A channel 13 for the passage, or replacement, of the heat transferring and/or fireproofing and/or electrically insulating liquid can be seen here in the internal bus bar portion $B_{2n}$, $B_{3n}$. The mechanical connection between the internal bus bar portion $B_{2n}$, $B_{3n}$, and the closing plate $BP_U$, $BP_D$, is ensured, for example, by means of a screw (not shown) in the axis FX2, through an insulated screw passage.

Figure 5C:
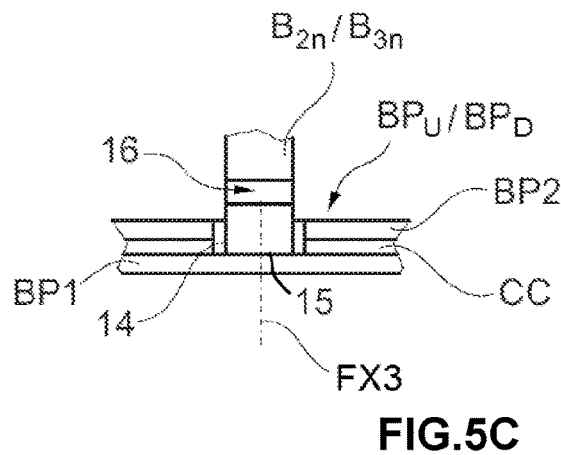

A second example of assembly between an internal bus bar portion $B_{2n}$, or $B_{3n}$, and the closing plate $BP_U$, or $BP_D$, is shown in FIG. 5C. The assembly example of FIG. 5C corresponds to the case where the conductive plate BP1 and the internal bus bar portion $B_{2n}$, $B_{3n}$, are intended to be set at the same electrical potential. As shown in FIG. 5C, the end of the internal bus bar portion $B_{2n}$, $B_{3n}$, is housed in a groove 15 which is accommodated in the plate $BP_U$, $BP_D$, and which allows mechanical indexing and electrical contact with the conductive plate BP1. The material of the conductive plate BP2 and of the dielectric layer CC are withdrawn into the groove 15 and the end of the internal bus bar portion $B_{2n}$, $B_{3n}$, is in electrical contact only with the conductive plate BP1. An electrical insulator 14 is provided in the groove 15 for insulation with the conductive plate BP1. A channel 16 for the passage, or replacement, of the heat transferring and/or fireproofing and/or electrically insulating liquid can be seen in the internal bus bar portion B2n, B3n. The mechanical attachment between the internal bus bar portion $B_{2n}$, $B_{3n}$, and the closing plate $BP_U$, $BP_D$, is ensured, for example, by means of a screw (not shown) in the axis FX3.

The invention is not limited to the particular embodiment which has been described here by way of example. A person skilled in the art, according to the applications of the invention, could provide different modifications and variants which fall within the scope of the annexed claims.

The invention claimed is:

1. An assembly of bus bars forming a casing and heat dissipator for an electronic power device, said assembly comprising a plurality of bus bar sectors which are arranged, in a connected manner and in electrical contact, around a central axis and upper and lower closing plates which are perpendicular to the central axis, said bus bar sectors each comprising an external bus bar portion and at least one internal bus bar portion which delimit a plurality of internal volumes, said upper and lower closing plates being in contact against upper and lower faces of said external bus bar portion and said at least one internal bus bar portion, respectively, and said external bus bar portion and said at least one internal bus bar portion comprising a plurality of electrical contact faces of the "press pack" type.

2. The assembly of bus bars according to claim 1, wherein said external bus bar portions of said plurality of bus bar sectors comprise cooling fins on an external face thereof.

3. The assembly of bus bars according to claim 1, wherein said bus bar portions of said plurality of bus bar sectors are made of at least one of copper and aluminum and are produced by one or more of molding, machining, or cutting a profiled bar.

4. The assembly of bus bars according to claim 1, wherein said assembly comprises seals located in the connection faces between adjacent external bus bar portions and between said upper and lower closing plates and said external bus bar portions.

5. The assembly of bus bars according to claim 1, wherein said upper and lower closing plates are laminated and each comprise a central dielectric layer and two electrically conductive plates on both sides of said central dielectric layer, said electrically conductive plates being in electrical contact with said bus bar portions.

6. The assembly of bus bars according to claim 5, wherein said central dielectric layer comprises at least one embedded electronic circuit at least one active or passive embedded electronic component.

7. The assembly of bus bars according to claim 5, wherein the at least one of said upper and lower closing plates is of the "IMS" type.

8. The assembly of bus bars according to claim 5, wherein said electrically conductive plates are made of at least one of copper and aluminum.

9. The assembly of bus bars according to claim 1, wherein, in each of said bus bar sectors, said plurality of internal volumes comprise a first internal volume delimited between an electrical contact face of said external bus bar portion and an electrical contact face of a first said internal bus bar portion, said first internal volume being intended for the "press pack" type installation of an electronic power circuit.

10. The assembly of bus bars according to claim 9, wherein in each of said bus bar sectors, said plurality of internal volumes comprise at least one other internal volume accommodated between said first internal bus bar portion and said central axis.

11. The assembly of bus bars according to claim 9, wherein, in each of said bus bar sectors, said plurality of internal volumes comprise a second internal volume accommodated between said first internal bus bar portion and a second said internal bus bar portion and a third internal volume accommodated between said second internal bus bar portion and said central axis.

* * * * *